(12) United States Patent
Tumpold et al.

(10) Patent No.: US 11,561,168 B2
(45) Date of Patent: Jan. 24, 2023

(54) RADIATION SOURCE AND GAS SENSOR USING THE RADIATION SOURCE

(71) Applicant: Infineon Technologies AG, Neubiberg (DE)

(72) Inventors: David Tumpold, Kirchheim b München (DE); Christoph Glacer, Munich (DE); Steffen Kubacki, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 17/122,490

(22) Filed: Dec. 15, 2020

(65) Prior Publication Data

US 2021/0231562 A1    Jul. 29, 2021

(30) Foreign Application Priority Data

Jan. 28, 2020 (EP) .................................. 20154153

(51) Int. Cl.
*G01N 21/3504* (2014.01)

(52) U.S. Cl.
CPC .......... *G01N 21/3504* (2013.01); *G01N 2201/06113* (2013.01); *G01N 2201/06153* (2013.01)

(58) Field of Classification Search
CPC ..... G01N 21/3504; G01N 2201/06113; G01N 2201/06153
See application file for complete search history.

(56) References Cited

U.S. PATENT DOCUMENTS

| 9,159,889 | B2 | 10/2015 | Weidner et al. |
| 2014/0209581 | A1 | 7/2014 | Pawlowski et al. |
| 2015/0285737 | A1 | 10/2015 | Gliere et al. |
| 2016/0327852 | A1* | 11/2016 | Watanabe .......... G02B 27/0081 |
| 2018/0026167 | A1* | 1/2018 | Eckert ..................... H01L 33/58 |
| | | | 257/98 |
| 2019/0339197 | A1* | 11/2019 | Boutami .............. G01N 29/032 |

FOREIGN PATENT DOCUMENTS

| WO | 2006135212 A1 | 12/2006 |
| WO | 2018121982 A1 | 7/2018 |

\* cited by examiner

*Primary Examiner* — Jamil Ahmed

(74) *Attorney, Agent, or Firm* — Slater Matsil, LLP

(57) ABSTRACT

A radiation source for obliquely launching a narrowband electromagnetic radiation into a cavity, comprises an emitter structure having a main radiation emission region for emitting the narrowband electromagnetic radiation, wherein the emitter structure is optically coupled to the cavity, and a layer element coupled to the main radiation emission region of the emitter structure, wherein the layer element comprises a radiation deflection structure configured for deflecting the radiation emission characteristic of the emitter structure with respect to the surface normal of the main radiation emission region of the emitter structure.

14 Claims, 7 Drawing Sheets

RADIATION SOURCE AND GAS SENSOR USING THE RADIATION SOURCE

CROSS-REFERENCE TO RELATED APPLICATIONS

This application claims the benefit of European Patent Application No. 20154153.9, filed on Jan. 28, 2020, which application is hereby incorporated herein by reference.

TECHNICAL FIELD

Embodiments of the present disclosure relate to the field of radiation sources, e.g. for gas detection. More specifically, embodiments relate to the field of radiation sources for obliquely launching a narrowband electromagnetic radiation, e.g. into a cavity. Alternative embodiments also relate to the field of gas sensors using such a radiation source.

BACKGROUND

The sensing of environmental parameters in the ambient atmosphere, such as noise, sound, temperature and gases, gains more and more importance in the implementation of appropriate sensors within mobile devices, home automation, such as smart home, and the automotive sector. Harmful gas concentrations can occur due to air pollution and malfunction of certain devices. The well-being is strongly influenced by the air quality. Gas detection by inexpensive, always available and connected sensors is an upcoming topic in the future. However, with the evermore extensive use of sensors, there is also a particular need to be able to produce such sensors as inexpensively as possible and, thus, cost effectively. However, the resulting reliability and accuracy of the sensors should nevertheless be maintained or even increased.

In particular, the field of monitoring the air quality in our environment gets more and more attention. A typical optical sensor, e.g. a photo acoustic sensor, comprises a radiation source, filter elements for a wavelength selection, a detector and the sample area where the light between the light source and the detector interacts with the environmental medium.

Generally, there is a need in the field for an approach to implement improved radiation sources for gas sensors, e.g. PAS sensors (PAS=photo-acoustic spectroscopy), having reduced fabrication requirements and providing an adequate sensitivity for the target gas to be detected by the sensor device.

Such a need can be solved by the radiation source according to claim 1 and the gas sensor according to claim 13.

Further, specific implementations of the radiation source are defined in the dependent claims.

SUMMARY

According to an embodiment, a radiation source for obliquely launching a narrowband electromagnetic radiation into a cavity comprises an emitter structure having a main radiation emission region for emitting the narrowband electromagnetic radiation, wherein the emitter structure is optically coupled to the cavity, and a layer element coupled to the main radiation emission region of the emitter structure, wherein the layer element comprises a radiation deflection structure configured for deflecting the radiation emission characteristic of the emitter structure with respect to the surface normal of the main radiation emission region of the emitter structure.

According to a further embodiment, a radiation source for obliquely emitting a narrowband IR radiation comprises an IR emitter structure having a main radiation emission region for emitting a narrowband IR radiation, and a layer element coupled to the main radiation emission region of the IR emitter structure, wherein the layer element comprises a IR radiation deflection structure arranged for deflecting the IR radiation emission characteristic of the IR emitter structure with respect to a surface normal of the main radiation emission region of the IR emitter structure.

According to a further embodiment, a gas sensor comprises the radiation source for oblique launching a narrowband electromagnetic radiation into a cavity or the radiation source for obliquely emitting a narrowband IR radiation, wherein the cavity is arranged for providing an optical interaction path for an interaction of the narrowband electromagnetic radiation having a center wavelength λ0 with a target gas in the cavity, wherein the cavity is accessible for an environmental gas comprising the target gas component, and a radiation detector arranged to provide a detector output signal based on a signal strength of the narrowband electromagnetic radiation having traversed the optical interaction path and the cavity, and being received by the radiation detector.

BRIEF DESCRIPTION OF THE DRAWINGS

In the following, embodiments of the present disclosure are described in more detail with reference to the figures, in which.

Before discussing the present embodiments in further detail using the drawings, it is pointed out that in the figures and the specification identical elements and elements having the same functionality and/or the same technical or physical effect are usually provided with the same reference numbers or are identified with the same name, so that the description of these elements and of the functionality thereof as illustrated in the different embodiments are mutually exchangeable or may be applied to one another in the different embodiments.

DETAILED DESCRIPTION OF ILLUSTRATIVE EMBODIMENTS

In the following description, embodiments are discussed in detail, however, it should be appreciated that the embodiments provide many applicable concepts that can be embodied in a wide variety of semiconductor devices. The specific embodiments discussed are merely illustrative of specific ways to make and use the present concept, and do not limit the scope of the embodiments. In the following description of embodiments, the same or similar elements having the same function have associated therewith the same reference signs or the same name, and a description of such elements will not be repeated for every embodiment. Moreover, features of the different embodiments described hereinafter may be combined with each other, unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

For facilitating the description of the different embodiments, the figures comprise a Cartesian coordinate system x, y, z, wherein the x-y-plane corresponds, i.e. is parallel, to the first main surface region of the substrate, and wherein the depth direction vertical to the first main surface region and into the semiconductor substrate corresponds to the "–z" direction, i.e. is parallel to the z direction. In the following description, the term "lateral" means a direction parallel to the x- and/or y-direction, wherein the term "vertical" means a direction parallel to the z-direction.

Figure 1A:
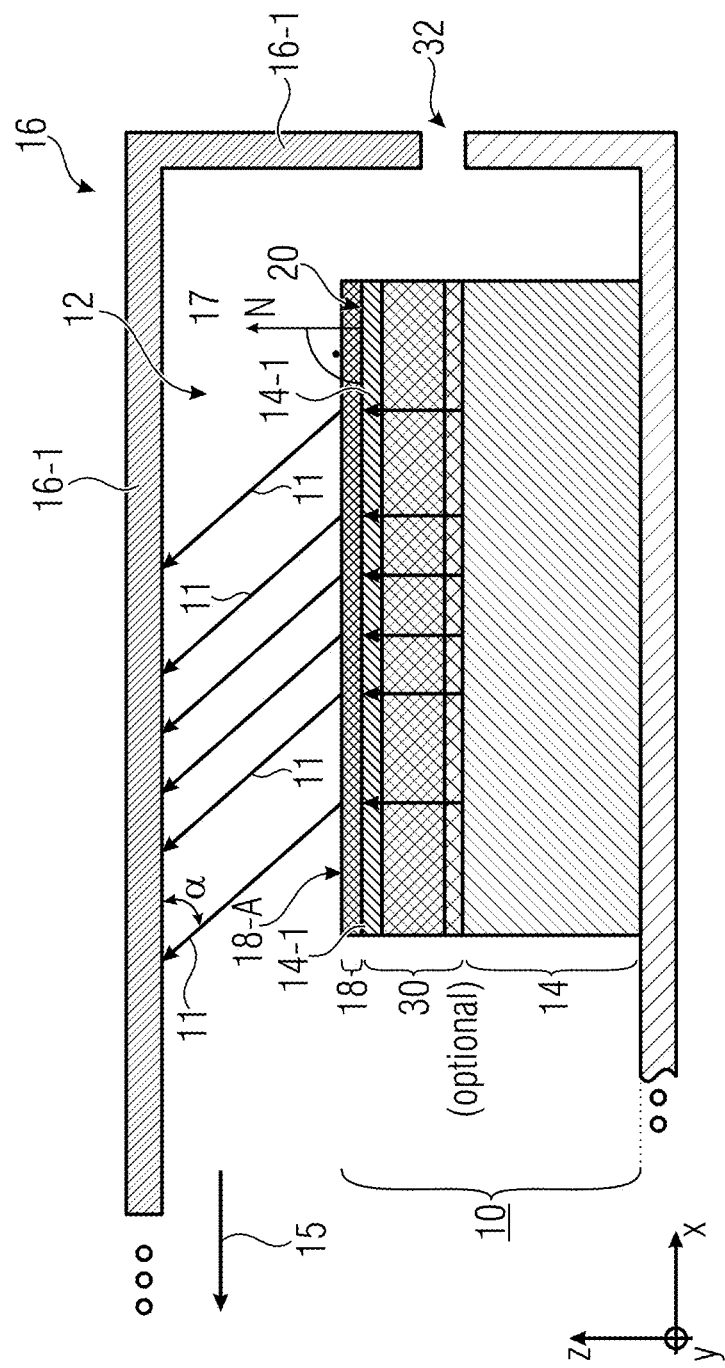
FIGS. 1*a*-1*b* show a schematic cross-sectional view of an IR radiation source according to an embodiment.

FIG. 1a shows a radiation source 10 for obliquely launching a narrowband electromagnetic radiation 11 into a cavity 12 according to an embodiment. In FIG. 1a, the drawing plane is parallel to the x-z-plane.

According to an embodiment, the radiation source 10 comprises an emitter structure 14 and a layer element 18. The emitter structure 14 has a main radiation emission region 14-1 for emitting the narrowband electromagnetic radiation 11, wherein the emitter structure 14 is optically coupled to the cavity 12. The layer element 18 is coupled to the main radiation emission region 14-1 of the emitter structure 14, wherein the layer element 18 comprises a radiation deflection (distortion) structure 20 which is configured for deflecting or inclining the radiation emission characteristic 14-A of the emitter structure 14 with respect to the surface normal N of the main radiation emission region 14-1 of the emitter structure 14.

Figure 1B:
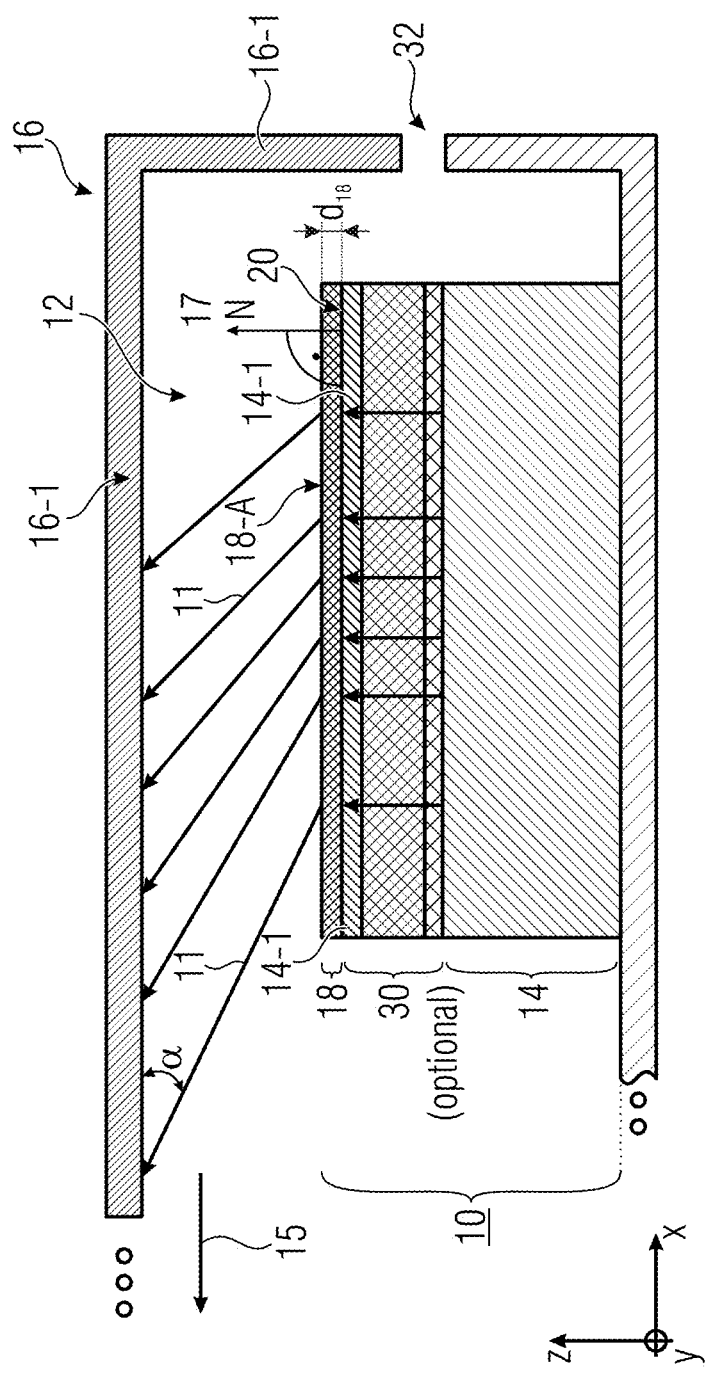
Figure 1C:
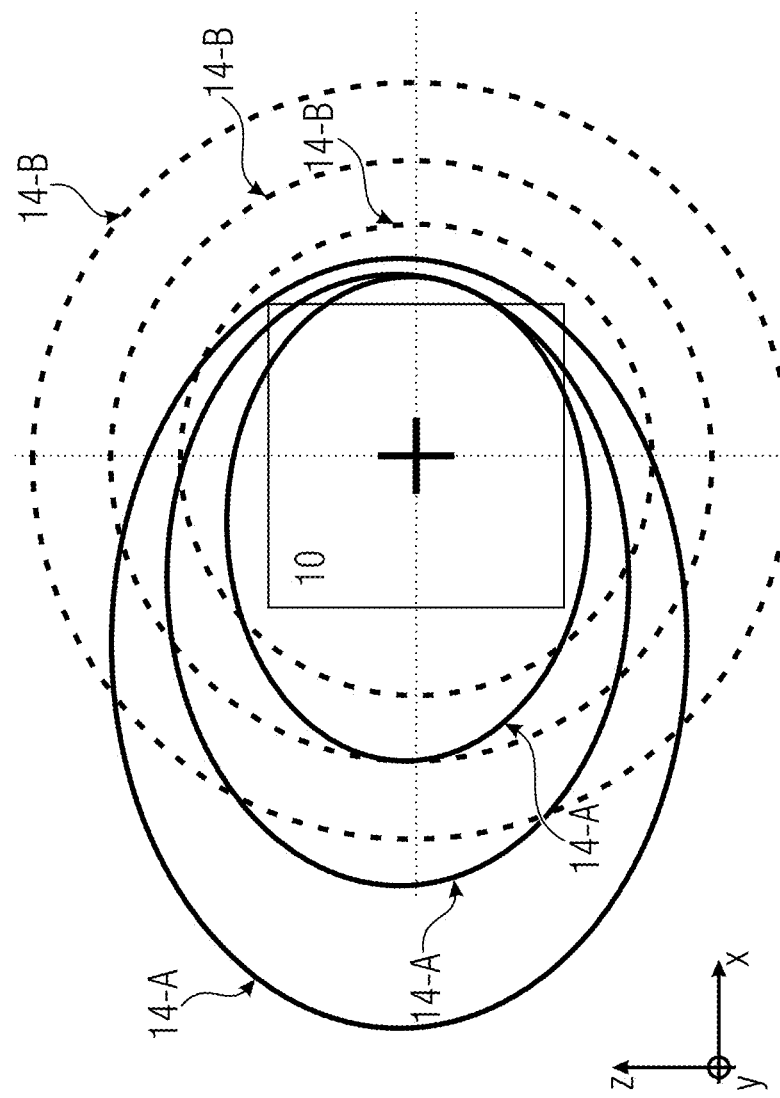
FIG. 1*c* shows a resulting radiation emission characteristic of the radiation source according to an embodiment in comparison to a conventional radiation emission characteristic of a conventional radiation source.

The term "deflecting" the radiation emission characteristic of the emitter structure may also include the meaning of distorting, off-centering and/or deforming the radiation emission characteristic 14-A of the emitter structure, when compared, for example, to a conventional, circular radiation emission characteristic of a conventional radiation source (see e.g. the dashed lines in FIG. 1c). The conventional, circular radiation emission characteristic 14-B of a conventional radiation source may comprise a main emission direction, for example, which is directed parallel to a surface normal of the main emission region of such a conventional radiation source.

In case, the radiation emission characteristic of the emitter structure 14 is already deflected with respect to the surface normal of the main radiation emission region 14-1 of the emitter structure 14, the radiation deflection (=distortion) structure 20 is configured for further deflecting or distorting (e.g. additionally inclining) the radiation emission characteristic of the emitter structure 14 with respect to the surface normal of the main radiation emission region 14-1 of the emitter structure 14.

Thus, the radiation deflection structure 20 is configured for changing the main radiation emission direction 14-A or the radiation emission distribution of the emitter structure 14, wherein the surface normal N of the main radiation emission region 14-1 of the emitter structure 14 may be regarded as a reference direction for describing the radiation emission characteristic of the emitter structure 14. Thus, the radiation emission characteristic of the emitter structure 14 is changed, i.e. in the meaning of deflected, distorted, off-centered and/or deformed, with respect to the surface normal of the main radiation emission region 14-1 or another reference direction with respect to the main radiation emission region 14-1 of the emitter structure 14.

According to an embodiment, the cavity 12 into which the narrowband electromagnetic radiation 11 is launched provides an optical interaction path 15 for an interaction of the narrowband electromagnetic radiation 11 having a center wavelength $\lambda 0$ with a target gas 17 in the cavity 12, wherein the cavity 12 may be accessible for an environmental gas or environmental gas mixture comprising the target gas component. In the interaction region, the target gas component absorbs the IR radiation having the center wavelength $\lambda 0$, if the IR radiation 11 having a center wavelength $\lambda 0$ falls in the absorption spectrum of the target gas component. The degree of absorption depends on or is a measure of the concentration of a target gas component in an environmental gas.

To be more specific, the intermittent or periodic absorption and related thermal heating and cooling of the target gas inside the measurement cavity 12 may produce an alternating increase and decrease of gas pressure (=pneumatic pressure) inside the cavity 12. This pressure change or variation may be detected by an acoustic transducer, for example, a pressure sensitive transducer, e.g. a MEMS microphone. The amount of absorption of the emitted thermal radiation by the gases and the related pressure variations inside the cavity 12 may depend on the sort of gas inside the cavity and it may vary with the respective target gas and its concentration. Each target gas may comprise a characteristic absorption spectrum, i.e. it may cause characteristic pressure variations in response to the intermittently emitted thermal radiation. The characteristic absorption spectrum may also be referred to as a gas-specific fingerprint. Accordingly, the acoustic transducer (see FIG. 5, for example) may record a signal that may be characteristic for the respective target gas, such that the acoustic transducer may thereby detect and identify the respective target gas and its concentration.

As shown in FIG. 1a, the cavity 12 is formed by inner wall elements 16-1 of a housing 16, wherein the layer element 18 comprises the radiation deflection structure 20 for deflecting the radiation emission characteristic of the emitter structure 14 with respect to the inner wall element 16-1 which faces the main radiation emission region 14-1 of the emitter structure 14. The inner wall element 16-1 may comprise a planar surface, wherein the surface normal of the inner wall element 16-1 and the main radiation emission region 14-1 of the emitter structure 14 may be arranged parallel or essentially parallel to each other.

The cavity 12 may be a substantially closed cavity surrounding the emitter structure 14 having the layer element 18, wherein the cavity 12 may comprise at least one access opening 32 through which environmental gases, e.g. ambient air, may flow into the cavity. The cavity 12 may be formed by the inner wall elements of the housing.

As exemplarily shown in FIG. 1a, the optical directivity layer 18 having the thickness d18 may be arranged for providing a (relatively) parallel deflection or inclination of the emitted radiation 11 along the diameter D of the layer element 18.

FIG. 1b shows a further radiation source 10 for obliquely launching a narrowband electromagnetic radiation 11 into a cavity 12 according to a further embodiment. The radiation source 10 of FIG. 1b has essentially the same functionality and structure as the radiation source 10 of FIG. 1a, wherein the optical directivity layer 18 may also arranged for providing a variation or change of the deflection of the emitted radiation 11 along the diameter D of the layer element 18.

FIG. 1 shows a resulting radiation emission characteristic 14-A of the radiation source 14 according to an embodiment in comparison to a conventional radiation emission characteristic of a conventional radiation source. The conventional, radiation emission characteristic is shown in dashed lines. In FIG. 1c, the optical intensity pattern according to its radiation emission profile is drawn parallel to the x-y-plane.

As shown in FIG. 1c, the radiation emission characteristic of a conventional emitter structure is usually circular and centered (see the dashed line of FIG. 1c with respect to the main radiation emission region of a conventional emitter. As the optical radiation is circular and centered with respect to the light source, an essential portion of the emitted radiation hits the cavity wall which faces the emitter perpendicularly or nearly perpendicularly. Thus, an essential portion of the emitted radiation may be reflected back to the conventional emitter, e.g. due parallel or co-planar walls of the cavity.

As further shown in FIG. 1c, the adjusted radiation emission characteristic of the emitter structure according to an embodiment is deflected, e.g. off-centered and/or deformed, with respect to the surface normal N of the main radiation emission region 14-1 of the emitter structure 14 according to an embodiment. As the optical radiation 11 is deflected with respect to the surface normal of the main radiation emission region 14-1 of the emitter structure 14, an essential or main portion of the emitted radiation hits a cavity wall which faces the emitter in an acute angle α, e.g. with an angle of impact between 10° and 70° or between 20° and 60° and is accordingly reflected. Thus, an essential portion of the emitted radiation may be reflected a multiple times at the different cavity walls and may achieve a significant interaction length 15 with (=optical path length in) the target gas component in the cavity 12. This is especially true, if the cavity 12 is formed as a waveguide or a reflecting housing, wherein reflective coatings such as metal layers on shaped structural housing walls (=cavity walls) 16-1 guide the emitted radiation 11 thorough the interaction path by means of reflections.

According to an embodiment, the main radiation emission region 14-1 of the emitter structure 14 is configured for emitting the narrowband electromagnetic radiation 11. Accordingly, the emitter structure 14 may be configured to emit electromagnetic radiation, e.g. thermal radiation, in a specific wavelength spectrum into the cavity 12. The wavelength of the emitted narrowband electromagnetic (e.g. thermal) radiation may depend on the gas to be detected, i.e. the target gas in the environmental atmosphere. The target gas may comprise carbon monoxide CO, carbon dioxide $CO_2$, ozone $O_3$, nitrogen oxide NOx, methane $CH_4$, etc., for example. However, this list of target gases to be detected is not to be regarded as exhaustive.

According to an embodiment, the emitter structure 14 may be configured to intermittently or periodically emit the narrowband electromagnetic radiation. The emitter structure 14 may also comprise a thermal source and/or an infrared source and, optionally, a wavelength selective structure 30 configured for providing the narrowband electromagnetic radiation 11. Accordingly, the environmental gas inside the cavity 12, including the target gas, absorbs the emitted electromagnetic radiation 11, wherein this absorption of the gases may produce an increase of temperature and, thus, of pressure inside the cavity 12. This alternating change in pressure may be detected by an acoustic transducer, for example (not shown in FIGS. 1a-1b). The amount of absorption of the emitted thermal radiation by the target gas and the related pressure change inside the cavity 12 may depend on the sort and the amount of the target gas inside the cavity 12 and may vary with the target gas. The emitter structure 14 is optically coupled to the cavity 12.

In the present description, infrared radiation (IR) is mentioned as one non-limiting example of a thermal radiation. Thermal radiation may be any radiation above absolute zero starting at 0° Kelvin. Infrared radiation may be a particular part of a thermal radiation in general. Additionally, radiation source is mentioned and may comprise an infrared radiation source, a light emitting diode (LED), a laser source or a thermal source.

According to an embodiment, typical dimensions for the thickness d18 of the layer element 18 of FIGS. 1a-1b may be in the range between 100 nm and a few micrometers (e.g. 2, 3 or 4 m). If the dimension (=thickness d18) of the layer element 18 reaches or comprises an integer multiple of a quarter of the wavelength of the radiation R, e.g. a half of the wave-length or a quarter of the wavelength of the IR radiation emitted by the emitter structure 14, then the layer element 18 may act itself as a filter, e.g. as a plasmonic structure in a plane parallel to the z direction and/or a Bragg filter parallel to the x/y plane. Thus, the layer element 18 itself may provide the functionality of the optional wavelength selective structure (IR filter) 30, for example, for providing the narrowband electromagnetic radiation 11.

Figure 2A:
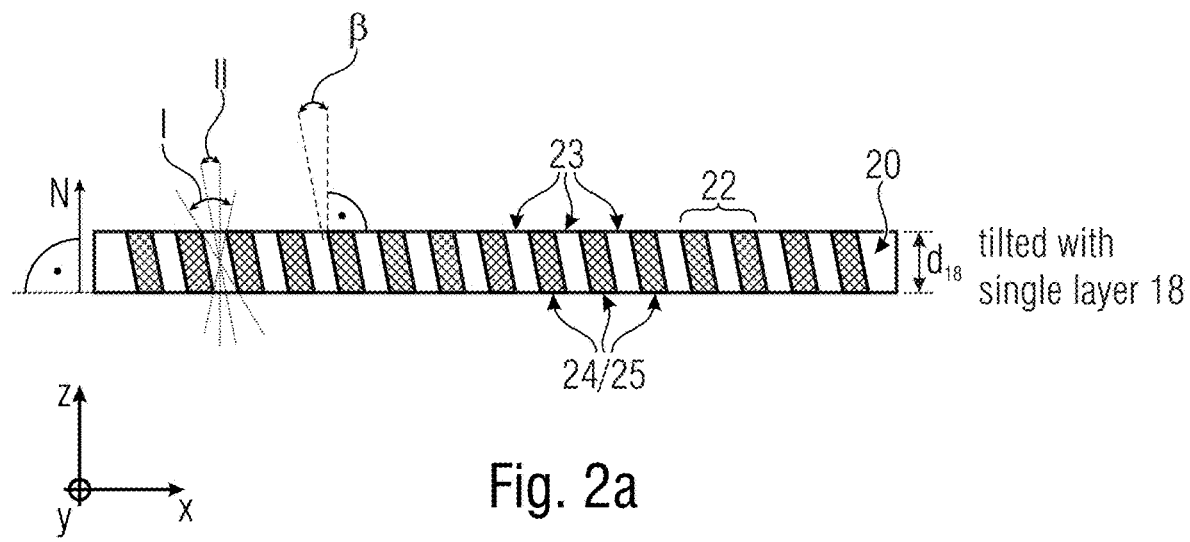
FIG. 2*a* shows a schematic cross-sectional view of an optical directivity layer used as radiation deflection structure for the radiation source according to an embodiment.
Figure 2B:
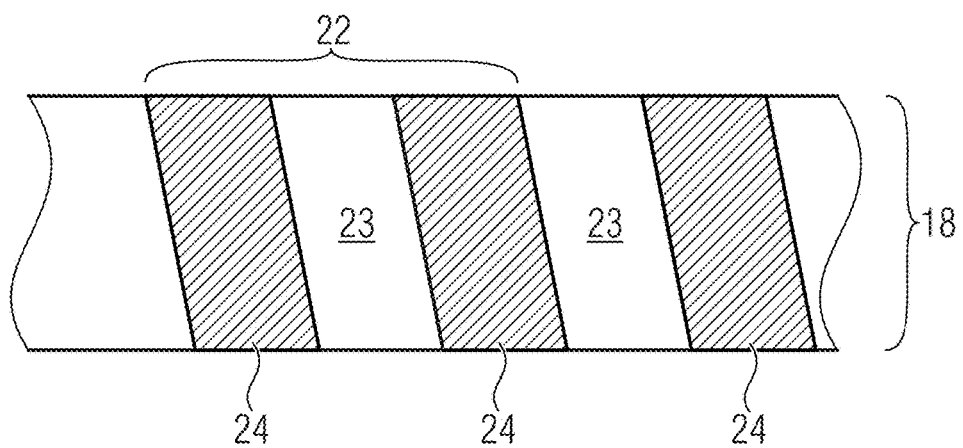
FIGS. 2*b*-2*c* show enlarged detail views of the optical directivity layer used as radiation deflection structure for the radiation source according to the further embodiment.
Figure 2C:
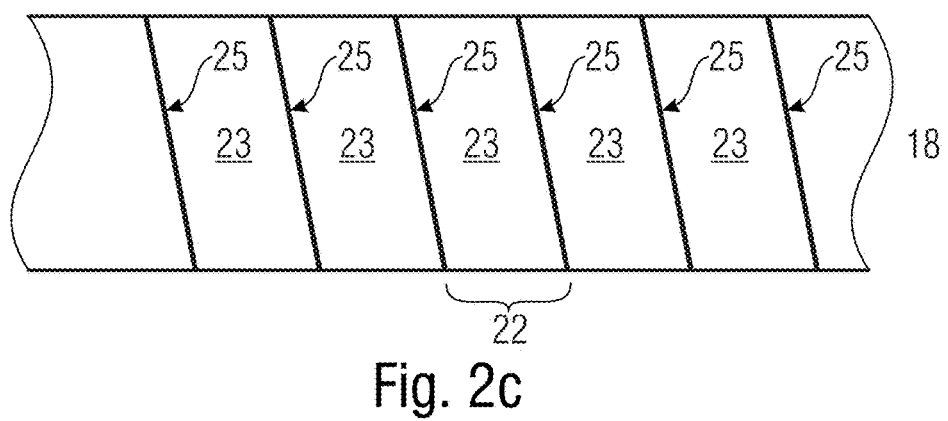

FIG. 2a shows a schematic cross-sectional view of an optical directivity layer 18 used as radiation deflection structure 18 having the thickness d18 for the radiation source 10 according to an embodiment. In FIGS. 2a-2c, the drawing plane is parallel to the x-z-plane.

According to an embodiment, the radiation deflection structure 20 of the layer element 18 comprises a plurality of light directing elements or light channels 22, wherein the orientation of the light directing elements 22 is angularly offset by an angle β with respect to a surface normal N of the main radiation emission region 14-1 of the emitter structure 14.

As shown in FIG. 2a, the broader angle range I describes the maximum optical transmission range of the light channels 22, wherein narrower angle range II describes the resulting deflection angle of the light channels 22 of the radiation deflection structure 20.

FIGS. 2b-2c show enlarged detail views of the optical directivity layer used as radiation distortion structure for the radiation source according to the further embodiment.

As shown in FIG. 2b, the light directing elements 22 may be formed as inclined transparent channels 23 separated by optically opaque or reflecting interlayers 24, wherein the trans-parent channels 23 and the optically opaque or reflecting interlayers 24 are arranged in an alternating and adjacent configuration.

As shown in FIG. 2c, the light directing elements 22 may comprise transparent regions 23 and opaque or reflective wall regions 25, wherein the transparent regions 23 and the opaque or reflective wall regions 25 are arranged in an alternating and adjacent configuration.

According to the embodiments of FIGS. 2a-2c, the transparent regions 23 may comprise, for example, glass, silicon oxide, silicon dioxide, polysilicon, silicon nitride, carbon and/or pyrex, as the transparent material. The opaque or reflective wall regions 24, 25 may comprise, for example, metal in general, e.g. aluminum, gold, platinum, etc., plastics, plastic compounds, carbon and/or a mold material, as the opaque or reflective material. Moreover, transparent materials can be used for reflective interfaces, if they are aligned properly to feature total-reflection.

Figure 3A:
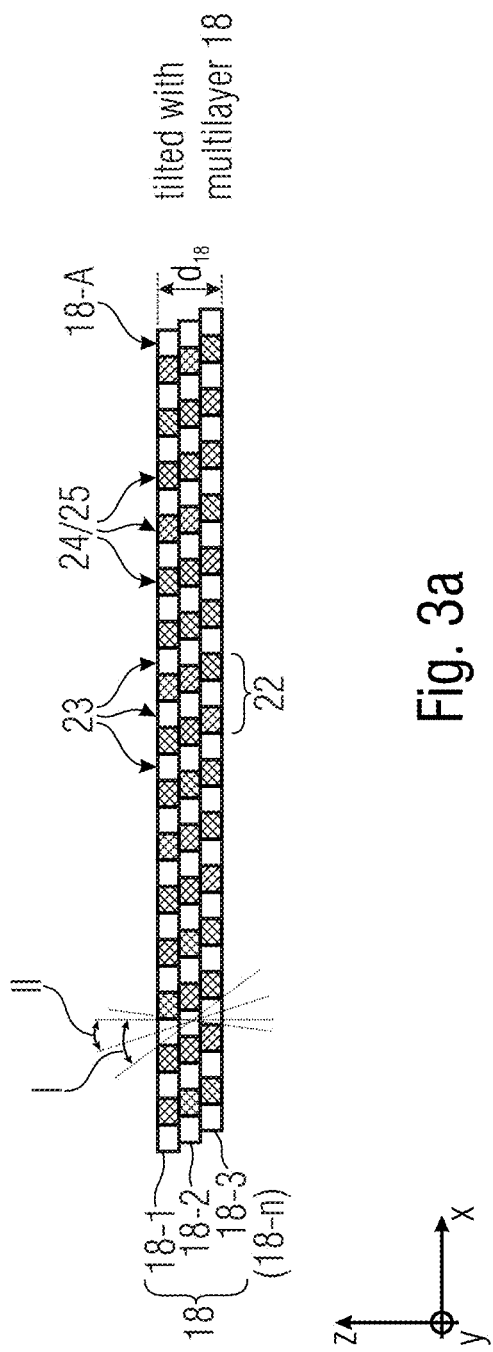
FIG. 3*a* shows a schematic cross-sectional view of an optical directivity layer used as radiation deflection structure for the radiation source according to a further embodiment.
Figure 3B:
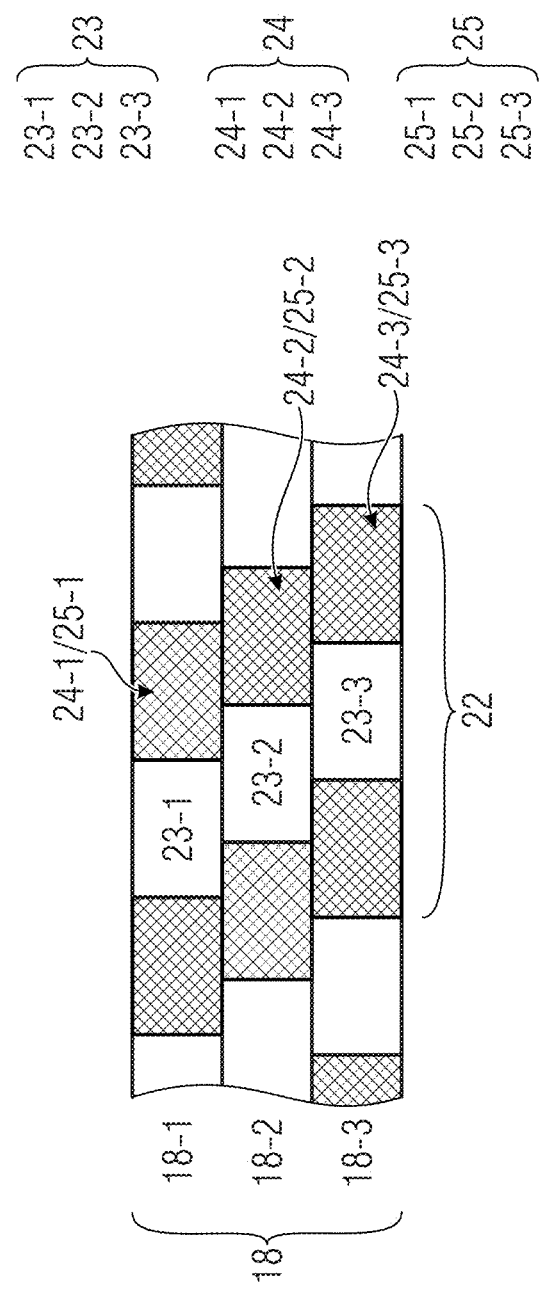
FIG. 3*b* shows an enlarged detail view of the optical directivity layer used as radiation deflection structure for the radiation source according to the further embodiment.

FIG. 3a shows a schematic cross-sectional view of an optical directivity layer 18 having the thickness d18 used as radiation distortion structure 20 for the radiation source 10 according to a further embodiment. In FIGS. 3a-3b, the drawing plane is parallel to the x-z-plane.

As shown in FIG. 3a, the layer element 18 may comprise a plurality of structured sublayers 18-1, . . . , 18-n arranged for providing the angularly offset light directing elements 22, wherein the sublayers 18-1, . . . , 18-n extend parallel to the surface of the main radiation emission region 14-1 of the emitter structure 14. As exemplarily shown in FIG. 3a, the layer element 18 may comprise three structured sublayers 18-1, 18-2, 18-3. However, the number n of sublayers 18-n may depend on the respective thickness of the sublayers and of the required thickness d18 of the resulting layer element 18 for providing the required channel length and channel angle with respect to the surface normal N of the main radiation emission region 14-1 of the emitter structure 14. By forming the layer element 18 with a plurality of structured sublayers 18-1, . . . , 18-n, an exact repeatability of the tilted light directing elements 22 can be achieved.

As shown in FIG. 3a, the broader angle range I describes the maximum optical transmission range of the light channels 22, wherein narrower angle range II describes the resulting deflection angle of the light channels 22 of the radiation deflection structure 20.

FIG. 3b shows an enlarged detail view of the optical directivity layer 18 used as radiation distortion structure 20 for the radiation source 10 according to the further embodiment. The light directing elements 22 comprise transparent regions 23-1, . . . , 23-n and opaque or reflective wall regions 24-1, . . . , 24-n, 25-1, . . . , 25-n, wherein the transparent regions 23-1, . . . , 23-2 and the opaque or reflective wall regions 24-1, . . . , 24-n, 25-1, . . . , 25-n are arranged in an alternating and adjacent configuration in the structured sublayers 18-1, 18-2, 18-3. The transparent regions 23-n may comprise, for example, glass, silicon oxide, silicon dioxide, polysilicon, silicon nitride, carbon and/or pyrex as the transparent material. The opaque or reflective wall regions 24-1, . . . , 24-n (=24), 25-1, . . . , 25-n (=25) may comprise, for example, metal in general, e.g. aluminum, gold, platinum, etc., plastics, plastic compounds, carbon and/or a mold material, as the opaque or reflective material. Moreover, transparent materials can be used for reflective interfaces, if they are aligned properly to feature total-reflection.

As exemplarily shown in FIGS. 2a-2c and 3a-3b, the light directing elements 22 of the optical directivity layer 18 are arranged in a parallel orientation or direction with respect to each other for providing a (relatively) parallel deflection or inclination of the emitted radiation 11 (see FIG. 1a, for example).

Thus, the radiation deflection structure 20 in the layer element 18 may be arranged for providing (relatively) constant and/or identical deflection angles (=tilt) β of the emitted radiation 1 along the diameter D (and to the edge) of the layer element 18, which results in a (relatively) parallel deflection or inclination of the emitted radiation 11 with respect to a surface normal of the main surface region 18-A of the layer element 18 along the diameter D thereof. This parallel deflection of the emitted radiation 11 can be achieved, for example, by a parallel orientation of the light directing elements 22 (see FIGS. 2a-2c and 3a-3b) of the radiation deflection structure 20 in the layer element 18. Thus, the light directing elements 22 are arranged in a parallel orientation or direction with respect to each other.

According to a further embodiment, the light directing elements 22 of the optical directivity layer 18 may also arranged in different orientations or directions with respect to each other for providing a variation of the deflection of the emitted radiation 1 (see FIG. 1b, for example). According to the radiation source 10 of FIG. 1b for obliquely launching a narrowband electromagnetic radiation 11 into a cavity 12, the optical directivity layer (=layer element) 18 may be arranged for providing changing or different deflection angles (=tilt) β of the emitted radiation 1 along the diameter D (and to the edge) of the layer element 18, which results in a changing or different deflection or inclination of the emitted radiation 11 with respect to a surface normal of the main surface region 18-A of the layer element 18 along the diameter D. As shown in FIG. 1b above, the layer element 18 may be arranged for providing increasing deflection angles (=tilt) β of the emitted radiation 11 along the diameter D.

This variation of the deflection of the emitted radiation 11 can be achieved, for example, by a (increasingly or decreasingly) changing the deflection angles β (=tilt) and/or the orientation of the light directing elements 22 of the radiation deflection structure 20 in the layer element 18. This variation of the deflection of the emitted radiation 11 can be also achieved, for example, by a sectionally changing orientation of the light directing elements 22 of the radiation deflection structure 20 in the layer element 18, e.g. of groups of the light directing elements 22. Thus, the light directing elements 22 may be arranged in different orientations or directions with respect to each other.

According to an embodiment, the emitter structure 14 may comprises an LED element, a laser element and/or an infrared source (=thermal source). According to a further embodiment, wherein the emitter structure 14 may comprise an infrared source and a wavelength selective structure 30 configured for providing the narrowband electromagnetic radiation 11.

Referring to all embodiments described above, the radiation source 10 for obliquely launching a narrowband electromagnetic radiation 11 into a cavity 12 is implemented by attaching a optical interface, which is formed by the layer element 18, to the optical window 14-1 of the light/radiation source 10, i.e. to the main radiation emission region 14-1 of the emitter structure 14. The optical interface 18 changes the directivity pattern, i.e. the radiation emission characteristic of the emitter structure 14, with respect to the light intensity and the package geometry to optimize the irradiation of the volume, i.e. the interaction region, in the cavity 12.

According to embodiments, the layer or stack of layers 18 may function as a wave guide for the light (=radiation)

emitted into the cavity 12, e.g. a PAS cavity (PAS=photo-acoustic spectroscopy) to increase the absorption distance of the radiation 11 in the cavity 12.

The described embodiments of the radiation source 10 can be implemented by keeping the mounting principle of SMD or similar simple and standard, wherein the optical radiation direction can be adjusted by the means of the optical directivity layer 18.

According to an embodiment, the optical directivity layer (=layer element) 18 may be implemented as a lateral layer which is structured to a wave guide and/or to reflect the outgoing light (=radiation) 11 and which may be attached to and/or may be part of the filter (=the wavelength selective structure).

According to an embodiment, the layer element 18 may comprise alternating optically transparent and optically blocking (absorbing or reflecting) tilted trenches 22 wherein the layer element 18 may be perpendicularly arranged to the optical window 14-1 (=the main radiation emission region 14-1 of the emitter structure 14). The optical window 14-1 is the interface between the light/radiation source 10 and the package outside of the emitter structure 14.

According to an embodiment, the radiation source 10 may provide by means of the layer element 18 a collimated light (=radiation) 11 for launching into the cavity 18. Moreover, the outgoing light pattern may be optimized to increase the absorption path in a given cavity 12 and maximize irradiation of the target gas in this cavity 12.

According to an embodiment, the radiation source 10 may be a sub-part or component of a system, e.g. a Photo Acoustic Spectrometer (=PAS sensor) or non-dispersive infrared (NDIR) sensor. According to a further embodiment, the radiation source 10 may be applied for light radiating applications such as LEDs or bulbs.

Embodiments allow implementing a radiation source 10 having a small form factor, wherein also an inexpensive (less complex) packaging may be applied.

Figure 4:
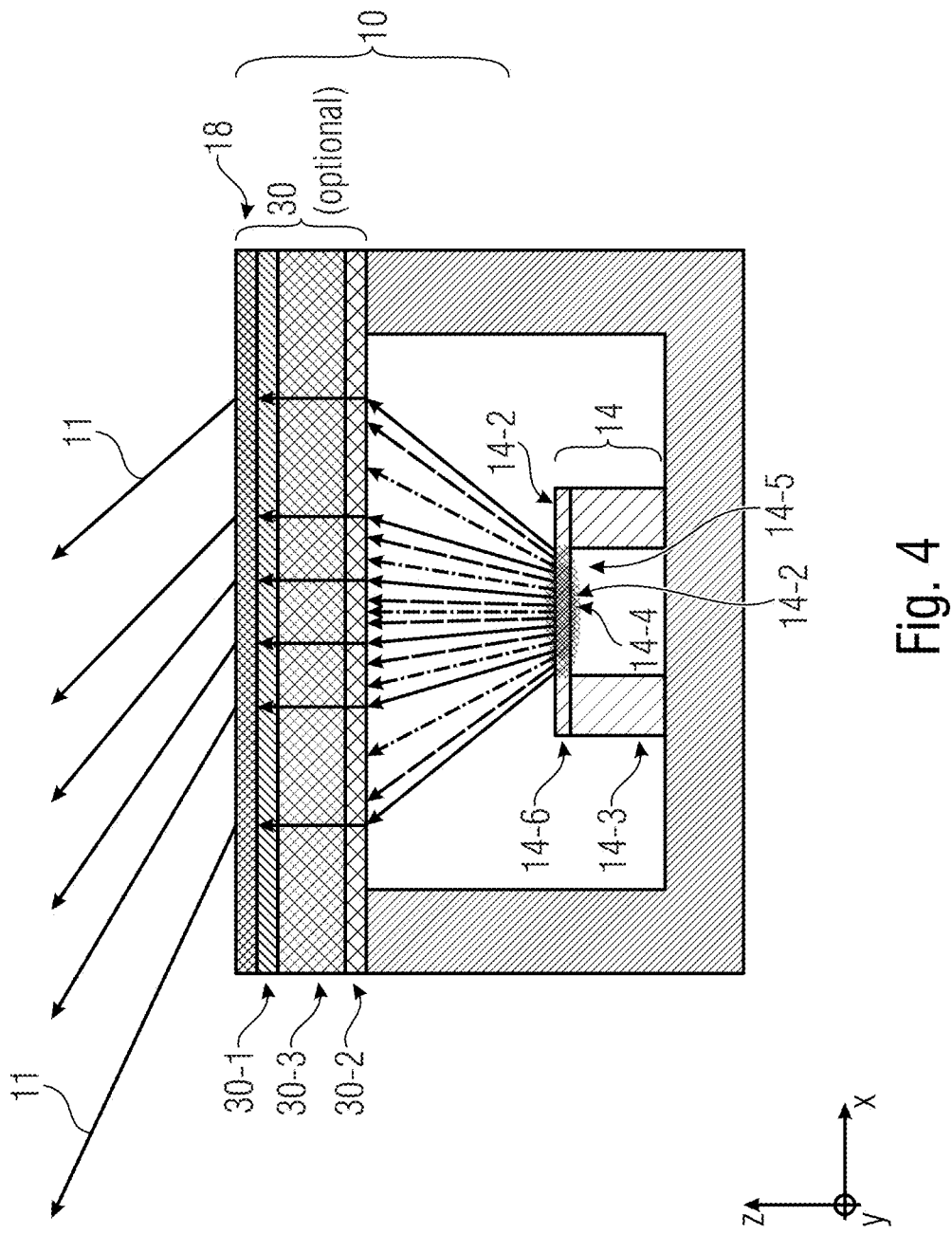
FIG. 4 shows a schematic cross-sectional view of a radiation source for obliquely emitting a narrowband IR radiation according to an embodiment.

FIG. 4 shows a schematic cross-sectional view of a radiation source 10 for obliquely emitting a narrowband IR radiation 11 according to a further embodiment. In FIG. 4, the drawing plane is parallel to the x-z-plane.

According to an embodiment, the radiation source 10 for obliquely emitting a narrowband IR radiation 11 comprises an IR emitter structure 14 having a main radiation emission region 14-1 for emitting a narrowband IR radiation 11, and a layer element 18 coupled to the main radiation emission region 14-A of the IR emitter structure 14. The layer element 18 comprises a IR radiation deflection structure 20 arranged for deflecting the IR radiation emission characteristic of the IR emitter structure 14 with respect to a surface normal of the main radiation emission region 14-A of the IR emitter structure 14.

The above evaluations in connection with FIGS. 1a-3b, which relate to a thermal (=IR) radiation source 10, are equally applicable to the radiation source 10 of FIG. 4.

According to an embodiment, the IR emitter structure 14 may be formed as a thermal emitter (=IR source) comprising a freestanding membrane 14-2 supported by a substrate 14-3, wherein the freestanding membrane 14-2 comprises a conductive section 14-4 which may be arranged on or embedded in the freestanding membrane 14-2. The conductive section 14-4 may comprise a conductive semiconductor material, which forms a current path for the thermal emitter. The conductive section 14-4 of the freestanding membrane 14-2 may comprise a heavily doped semiconductor layer which may comprise poly-silicon or monocrystalline silicon. The conductive section 14-4 of the freestanding membrane 14-2 may be arranged on a cavity 14-5 in the substrate 14-3, wherein the freestanding membrane 14-2 may covers the cavity 14-5 in the substrate 14-3. The substrate 14-3 may comprise a bulk semiconductor substrate and an insulating layer 14-6, wherein the insulating layer 14-6 forms a main surface region 14-A of the substrate 14-3 to which the freestanding membrane 14-2 is attached.

Furthermore, the membrane 14-2 may comprise a vertical thickness or height that is substantially smaller than its dimensions in the lateral extension direction. Thicknesses of certain elements, for example thicknesses of the membrane structure, the semiconductor substrate, the heating structure, the heating element and the gas adsorbing layer may not be drawn to scale.

According to an embodiment, the IR emitter structure 14 may comprise a wavelength selective structure (IR filter) 30 configured for providing the narrowband IR radiation 11 having the center wavelength $\lambda 0$, which falls in the absorption spectrum of the target gas component, for example.

The wavelength selective structure 30 may be formed as an IR filter, e.g. as a Fabry-Perot filter element with a FP filter stack (=Bragg mirrors) or with a first and second Fabry-Perot filter stacks 30-1, 30-2 which are arranged in an opposing, face-to-face configuration having interposed dielectric layer 30-3.

The wavelength selective structure 30 may also comprise a plasmonic structure on the freestanding membrane 14-2, wherein the plasmonic structure forms a bandpass filter for an IR radiation emitted by the freestanding membrane during an operation of the thermal emitter structure 14. The plasmonic structure 30 may form a plasmonic resonator for the emitted IR radiation.

According to an embodiment, the thermal emitter structure 10 is formed as a MEMS IR emitter having an operating temperature in the range between 800 to 1100° C.

According to an embodiment, the IR radiation source 10 may be arranged for oblique launching a narrowband IR radiation 11 into a cavity 12 (not shown in FIG. 4), wherein the IR emitter structure 14 may be coupled to a housing 16 (not shown in FIG. 4) having inner wall elements, which at least partially form the cavity 12, and wherein the IR radiation deflection structure 20 may be arranged for deflecting the IR radiation emission characteristic of the IR emitter structure 14 with respect to the wall element facing the main radiation emission region 14-A of the IR emitter structure 14.

According to an embodiment, the radiation deflection structure 20 of the layer element 18 comprises a plurality of light directing elements 22 between the opposing main surface regions 18-1 of the layer element 18, wherein the orientation of the light directing elements 22 is angularly offset with respect to a surface normal of the main radiation emission region 14-A of the IR emitter structure 14.

According to an embodiment, the light directing elements 22 are formed as inclined trans-parent channels separated by optically opaque or reflecting interlayers, wherein the transparent channels 22-1 and the optically opaque or reflecting interlayers 22-2 are arranged in an alternating and adjacent configuration.

According to an embodiment, the layer element 18 may comprise a plurality of structured sublayers 26 arranged for providing the angularly offset light directing elements 22, wherein the sublayers extend parallel to the main radiation emission region 14-A of the IR emitter structure 14.

Figure 5:
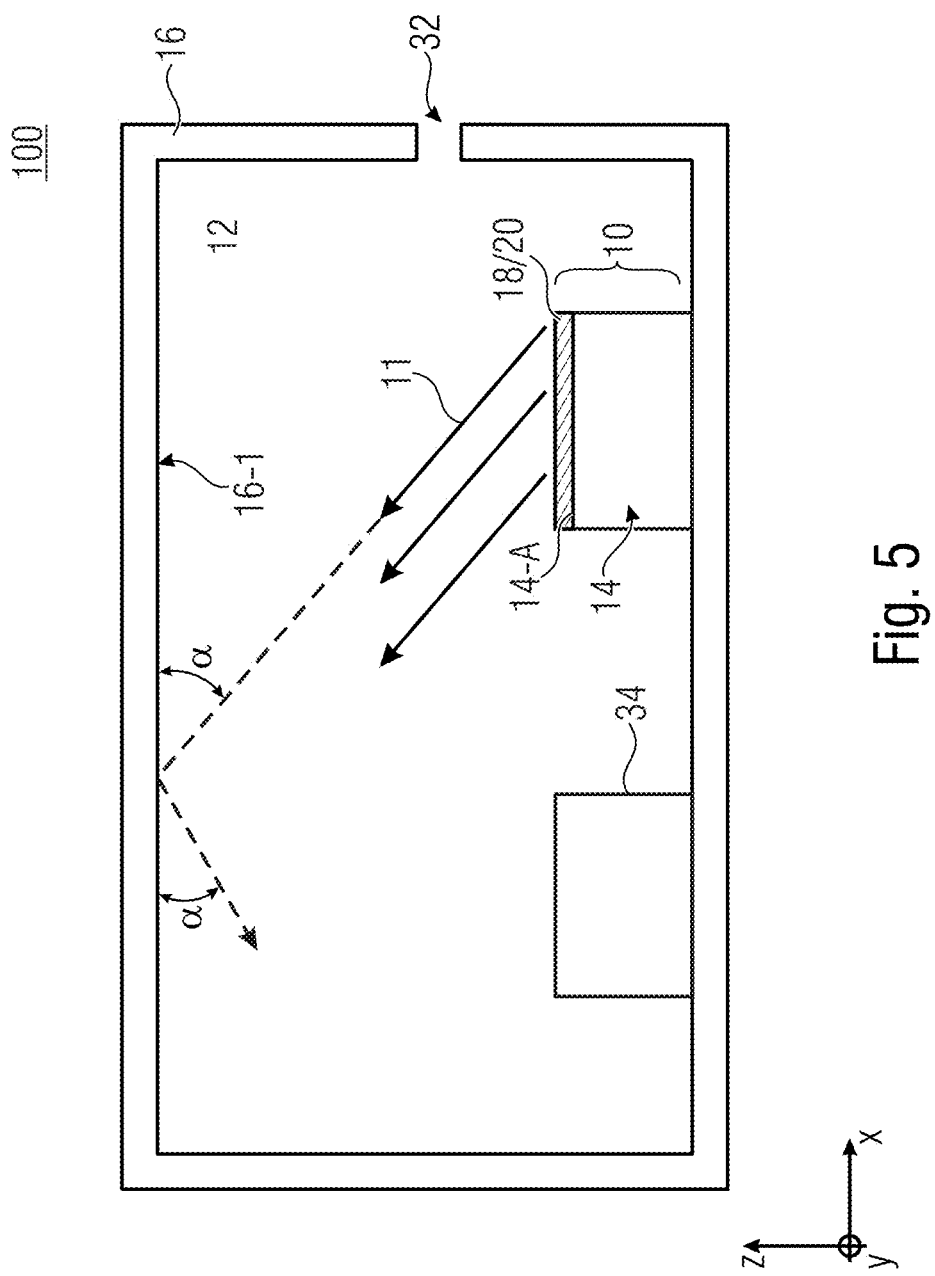
FIG. 5 shows a schematic cross-sectional view of a gas sensor (PAS sensor) according to an embodiment.

FIG. 5 shows a schematic cross-sectional view of a gas sensor (e.g. a PAS sensor) 100 according to an embodiment. In FIG. 5, the drawing plane is parallel to the x-z-plane.

The gas sensor 100 comprises the radiation source 10 for obliquely launching a narrow-band electromagnetic radiation 11 into a cavity 12 and/or for obliquely emitting a narrow-band IR radiation 11 according to any of the above described embodiments.

The above evaluations in connection with FIGS. 1a-1b, 2a-2c, 3a-3b and 4, which relate to the radiation source 10, are equally applicable to the radiation source 10 of FIG. 5.

The cavity 12 is arranged for providing an optical interaction path for an interaction of the narrowband electromagnetic radiation 11 having a center wavelength λ0 with a target gas in the cavity 12, wherein the cavity 12 is accessible, e.g. through an access opening 32 for an environmental gas comprising the target gas component.

The gas sensor further comprises a radiation detector 34 which is arranged to provide a detector output signal based on a signal strength of the narrowband electromagnetic radiation 11 having traversed the optical interaction path and the cavity 12, and being received by the radiation detector.

Thus, gas sensor 100 may formed as a MEMS gas sensor (MEMS=microelectromechanical system), which comprises a photoacoustic sensor 34 with the thermal emitter 10 according to any of the preceding embodiments, and an acoustic transducer 34, for example a MEMS microphone, wherein the thermal emitter 10 and the acoustic transducer 34 are arranged inside a mutual measurement cavity 12.

As described with respect to the previous embodiments, the adjusted radiation emission characteristic 14-A of the emitter structure 14 is deflected, e.g. off-centered and/or deformed, with respect to the surface normal N of the main radiation emission region 14-1 of the emitter structure 14. As the optical radiation 11 is deflected with respect to the surface normal N of the main radiation emission region 14-1 of the emitter structure 14, an essential or main portion of the emitted radiation 11 hits the cavity wall 16-1 which faces the emitter in an acute angle α, e.g. with an angle of impact between 10° and 700 or between 200 and 60° and is accordingly reflected. Thus, an essential portion of the emitted radiation 11 may be reflected a multiple times at the different cavity walls 16-1 and may achieve a significant interaction length 15 with (=optical path length in) the target gas component in the cavity 12. As the cavity 12 may be formed as a waveguide or a reflecting housing 36, reflective coatings such as metal layers on shaped structural housing walls 16-1 (=cavity walls) may guide the emitted radiation thorough the interaction path by means of reflections.

As shown in FIG. 5, the cavity 12 is formed by inner wall elements 16-1 of a housing 16, wherein the layer element 18 comprises the radiation deflection structure 20 for deflecting the radiation emission characteristic of the emitter structure 14 with respect to the inner wall element 16-1 which faces the main radiation emission region 14-A of the emitter structure 14. The inner wall element 16-1 may comprise a planar surface, wherein the surface normal of the inner wall element 16-1 and of the main radiation emission region 14-A of the emitter structure 14 may be arranged parallel or essentially parallel to each other. The cavity 12 may be a substantially closed cavity surrounding the emitter structure 14 having the layer element 18, wherein the cavity 12 may comprise at least one access opening 32 through which environmental gases, e.g. ambient air, may flow into the cavity. The cavity 12 may be formed by the inner wall elements of the housing.

The particular wavelength of the emitted radiation 11 may be set to the respective gas or gas composition to be detected, i.e. the so-called analytic or target gas. The emitter structure 14 may be configured to intermittently or periodically emit the thermal radiation 11. Accordingly, the environmental gas inside the measurement cavity 12, including the target gas, absorbs the intermittently emitted thermal radiation and, in consequence, the gases intermittently or periodically heats up and cools down in reaction to the emitted thermal radiation. As an essential portion of the emitted radiation may be reflected a multiple times at the different cavity walls and may achieve a significant interaction length with (=optical path length in) the target gas component in the cavity 12. This absorption and related heating and cooling of the gas inside the measurement cavity 12 may produce an alternating increase and decrease of pressure inside the cavity 12. These pressure variations may be detected by the acoustic transducer, for example a MEMS microphone. The amount of absorption of the emitted thermal radiation by the gases and the related pressure variations inside the cavity 12 may depend on the sort of gas inside the cavity and it may vary with the respective target gas and its concentration. Each target gas may comprise a characteristic absorption spectrum, i.e. it may cause characteristic pressure variations in response to the emitted thermal radiation. Said characteristic absorption spectrum may also be referred to as a gas-specific fingerprint. Accordingly, the acoustic transducer may record a signal that may be characteristic for the respective target gas, such that the acoustic transducer may thereby detect and identify the respective target gas.

Additional embodiments and aspects are described which may be used alone or in combination with the features and functionalities described herein.

According to an embodiment, a radiation source for obliquely launching a narrowband electromagnetic radiation into a cavity comprises an emitter structure having a main radiation emission region for emitting the narrowband electromagnetic radiation, wherein the emitter structure is optically coupled to the cavity, and a layer element coupled to the main radiation emission region of the emitter structure, wherein the layer element comprises a radiation deflection or distortion structure configured for deflecting the radiation emission characteristic of the emitter structure with respect to the surface normal of the main radiation emission region of the emitter structure.

According to an embodiment, the cavity is formed by inner wall elements of a housing, wherein the layer element comprises the radiation deflection structure for deflecting the radiation emission characteristic of the emitter structure with respect to the inner wall element which faces the main radiation emission region of the emitter structure.

According to an embodiment, the radiation deflection structure of the layer element comprises a plurality of light directing elements, wherein the orientation of the light directing elements is angularly offset with respect to a surface normal of the main radiation emission region of the emitter structure.

According to an embodiment, the light directing elements are formed as inclined transparent channels separated by optically opaque or reflecting interlayers, wherein the transparent channels and the optically opaque or reflecting interlayers are arranged in an alternating and adjacent configuration.

According to an embodiment, the light directing elements comprise transparent regions and opaque or reflective wall regions, wherein the transparent regions and the opaque or reflective wall regions are arranged in an alternating and adjacent configuration.

According to an embodiment, the layer element comprises a plurality of structured sublayers arranged for providing the angularly offset light directing elements, wherein the sublayers extend parallel to the main radiation emission region of the emitter structure.

According to an embodiment, the light directing elements are arranged in a parallel orientation with respect to each other.

According to an embodiment, the light directing elements comprise different orientations with respect to each other.

According to an embodiment, the emitter structure comprises an LED element, a laser element and/or an infrared source.

According to an embodiment, the emitter structure comprises an infrared source and a wavelength selective structure configured for providing the narrowband electromagnetic radiation.

According to an embodiment, a radiation source for obliquely emitting a narrowband IR radiation comprises an IR emitter structure having a main radiation emission region for emitting a narrowband IR radiation, and a layer element coupled to the main radiation emission region of the IR emitter structure, wherein the layer element comprises a IR radiation deflection structure arranged for deflecting the IR radiation emission characteristic of the IR emitter structure with respect to a surface normal of the main radiation emission region of the IR emitter structure.

According to an embodiment, the IR radiation source is arranged for oblique launching a narrowband IR radiation into a cavity, wherein the IR emitter structure is coupled to a housing having inner wall elements, which at least partially form the cavity, and wherein the IR radiation deflection structure is arranged for deflecting the IR radiation emission characteristic of the IR emitter structure with respect to the wall element facing the main radiation emission region of the IR emitter structure.

According to an embodiment, the radiation deflection structure of the layer element comprises a plurality of light directing elements between the opposing main surface regions of the layer element, wherein the orientation of the light directing elements is angularly offset with respect to a surface normal of the main radiation emission region of the IR emitter structure.

According to an embodiment, the light directing elements are formed as inclined transparent channels separated by optically opaque or reflecting interlayers, wherein the transparent channels and the optically opaque or reflecting interlayers are arranged in an alternating and adjacent configuration.

According to an embodiment, the layer element comprises a plurality of structured sublayers arranged for providing the angularly offset light directing elements, wherein the sublayers extend parallel to the main radiation emission region of the IR emitter structure.

According to an embodiment, the IR emitter structure comprises an infrared source and a wavelength selective structure configured for providing the narrowband IR radiation.

According to an embodiment, a thickness of the layer element has an integer multiple of a quarter of the wavelength of the of the IR radiation emitted by the emitter structure.

According to an embodiment, a gas sensor comprises the radiation source according to any of the preceding embodiments for oblique launching a narrowband electromagnetic radiation into a cavity, wherein the cavity is arranged for providing an optical interaction path for an interaction of the narrowband electromagnetic radiation having a center wavelength with a target gas in the cavity, wherein the cavity is accessible for an environmental gas comprising the target gas component, and a radiation detector arranged to provide a detector output signal based on a signal strength of the narrowband electromagnetic radiation having traversed the optical interaction path and the cavity, and being received by the radiation detector.

Although some aspects have been described as features in the context of an apparatus it is clear that such a description may also be regarded as a description of corresponding features of a method. Although some aspects have been described as features in the con-text of a method, it is clear that such a description may also be regarded as a description of corresponding features concerning the functionality of an apparatus.

In the foregoing detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

What is claimed is:

1. A radiation source for obliquely launching a narrowband electromagnetic radiation into a cavity, comprising:
    an emitter structure having a main radiation emission region for emitting the narrowband electromagnetic radiation, wherein the emitter structure is optically coupled to the cavity, and
    a layer element directly coupled to a planar upper surface of the main radiation emission region of the emitter structure, wherein the layer element comprises a radiation deflection structure configured for deflecting the radiation emission characteristic of the emitter structure with respect to a surface normal of the main radiation emission region of the emitter structure, and wherein the radiation deflection structure comprises a planar lower upper surface and a planar lower surface,
    wherein the radiation deflection structure of the layer element comprises a plurality of light directing elements, wherein an orientation of the light directing elements is angularly offset with respect to a surface normal of the main radiation emission region of the emitter structure, wherein the light directing elements are formed as inclined transparent channels separated by optically opaque or reflecting interlayers, and wherein the transparent channels and the optically opaque or reflecting interlayers are arranged in an alternating and adjacent configuration, such that each inclined transparent channel is contacted by at least one optically opaque interlayer or at least one reflecting interlayer.

2. The radiation source according to claim 1, wherein the cavity is formed by inner wall elements of a housing, wherein the layer element comprises the radiation deflection structure for deflecting the radiation emission characteristic of the emitter structure with respect to the inner wall element which faces the main radiation emission region of the emitter structure.

3. The radiation source according to claim 1, wherein the layer element comprises a plurality of structured sublayers arranged for providing the angularly offset light directing elements, wherein the sublayers extend parallel to the main radiation emission region of the emitter structure.

4. The radiation source according to claim 1, wherein the light directing elements are arranged in a parallel orientation with respect to each other.

5. The radiation source according to claim 1, wherein the light directing elements comprise different orientations with respect to each other.

6. The radiation source according to claim 1, wherein the emitter structure comprises an LED element, a laser element and/or an infrared source.

7. The radiation source according to claim 1, wherein the emitter structure comprises an infrared source and a wavelength selective structure configured for providing the narrowband electromagnetic radiation.

8. A radiation source for obliquely emitting a narrowband IR radiation, comprising:
an IR emitter structure having a main radiation emission region for emitting a narrowband IR radiation, and
a layer element directly coupled to a planar upper surface of the main radiation emission region of the IR emitter structure, wherein the layer element comprises a IR radiation deflection structure arranged for deflecting an IR radiation emission characteristic of the IR emitter structure with respect to a surface normal of the main radiation emission region of the IR emitter structure, and wherein the IR radiation deflection structure comprises a planar upper surface and a planar lower surface,
wherein the radiation deflection structure of the layer element comprises a plurality of light directing elements between opposing main surface regions of the layer element, wherein an orientation of the light directing elements is angularly offset with respect to a surface normal of the main radiation emission region of the IR emitter structure,
wherein the light directing elements are formed as inclined transparent channels separated by optically opaque or reflecting interlayers, and wherein the transparent channels and the optically opaque or reflecting interlayers are arranged in an alternating and adjacent configuration, such that each inclined transparent channel is contacted by at least one optically opaque interlayer or at least one reflecting interlayer.

9. The radiation source according to claim 8, wherein the radiation source is arranged for oblique launching a narrowband IR radiation into a cavity, wherein the IR emitter structure is coupled to a housing having inner wall elements, which at least partially form the cavity, and wherein the IR radiation deflection structure is arranged for deflecting the IR radiation emission characteristic of the IR emitter structure with respect to the wall element facing the main radiation emission region of the IR emitter structure.

10. The radiation source according to claim 8, wherein the layer element comprises a plurality of structured sublayers arranged for providing the angularly offset light directing elements, wherein the sublayers extend parallel to the main radiation emission region of the IR emitter structure.

11. The radiation source according to claim 8, wherein the IR emitter structure comprises an infrared source and a wavelength selective structure configured for providing the narrowband IR radiation.

12. The radiation source according to claim 8, wherein a thickness of the layer element comprises an integer multiple of a quarter of a wavelength of the of the IR radiation emitted by the emitter structure.

13. A gas sensor, comprising:
the radiation source according to claim 8 for oblique launching a narrowband electromagnetic radiation into a cavity,
wherein the cavity is arranged for providing an optical interaction path for an interaction of the narrowband electromagnetic radiation having a center wave-length $\lambda 0$ with a target gas in the cavity, wherein the cavity is accessible for an environmental gas comprising the target gas, and
a radiation detector arranged to provide a detector output signal based on a signal strength of the narrowband electromagnetic radiation having traversed the optical interaction path and the cavity, and being received by the radiation detector.

14. A radiation source for obliquely launching a narrowband electromagnetic radiation into a cavity, comprising:
an emitter structure having a main radiation emission region for emitting the narrowband electromagnetic radiation, wherein the emitter structure is optically coupled to the cavity, and
a layer element directly coupled to a planar upper surface of the main radiation emission region of the emitter structure, wherein the layer element comprises a radiation deflection structure configured for deflecting the radiation emission characteristic of the emitter structure with respect to a surface normal of the main radiation emission region of the emitter structure, and wherein the radiation deflection structure comprises a planar lower upper surface and a planar lower surface,
wherein the radiation deflection structure of the layer element comprises a plurality of light directing elements, wherein an orientation of the light directing elements is angularly offset with respect to a surface normal of the main radiation emission region of the emitter structure,
wherein the light directing elements comprise transparent regions and opaque or reflective wall regions, and wherein the transparent regions and the opaque or reflective wall regions are arranged in an alternating and adjacent configuration, such that each transparent region is contacted by at least one opaque wall region or at least one reflective wall region.

* * * * *